United States Patent
Van Den Brand et al.

(10) Patent No.: US 12,431,381 B2
(45) Date of Patent: Sep. 30, 2025

(54) LIGHT INDUCED SELECTIVE TRANSFER OF COMPONENTS BETWEEN SUBSTRATES

(71) Applicant: Nederlandse Organisatie voor toegepast-natuurwetenschappelijk onderzoek TNO, 's-Gravenhage (NL)

(72) Inventors: Jeroen Van Den Brand, Goirle (NL); Gari Arutinov, Helmond (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 708 days.

(21) Appl. No.: 17/612,093

(22) PCT Filed: May 20, 2020

(86) PCT No.: PCT/NL2020/050324
§ 371 (c)(1),
(2) Date: Nov. 17, 2021

(87) PCT Pub. No.: WO2020/235997
PCT Pub. Date: Nov. 26, 2020

(65) Prior Publication Data
US 2022/0216087 A1    Jul. 7, 2022

(30) Foreign Application Priority Data
May 21, 2019 (EP) .................... 19175621

(51) Int. Cl.
*H01L 21/683* (2006.01)
*C09J 5/06* (2006.01)
(Continued)

(52) U.S. Cl.
CPC ............ *H01L 21/6835* (2013.01); *C09J 5/06* (2013.01); *C09J 7/35* (2018.01); *H01L 25/0753* (2013.01);
(Continued)

(58) Field of Classification Search
CPC ............ H01L 2221/68368; H01L 2221/68354
See application file for complete search history.

(56) References Cited

U.S. PATENT DOCUMENTS

| | | |
|---|---|---|
| 2003/0087476 A1 | 5/2003 | Oohata et al. |
| 2005/0054121 A1 | 3/2005 | Handy et al. |

(Continued)

FOREIGN PATENT DOCUMENTS

| | | | | |
|---|---|---|---|---|
| CN | 109473532 A | * | 3/2019 | ....... H01L 21/67144 |
| CN | 109661122 A | | 4/2019 | |

(Continued)

OTHER PUBLICATIONS

European Patent Office, International Search Report in corresponding International Application No. PCT/NL2020/050324, dated Oct. 1, 2020 (8 pages).

(Continued)

*Primary Examiner* — Joshua Benitez Rosario
*Assistant Examiner* — Moataz Khalifa
(74) *Attorney, Agent, or Firm* — Leydig, Voit & Mayer, Ltd.

(57) ABSTRACT

A method and apparatus for transferring components. A first substrate is provided with the components. A second substrate is provided with an adhesive layer comprising a hot melt adhesive material. The components on the first substrate are contacted with the adhesive layer on the second substrate while the adhesive layer is melted. The adhesive layer is allowed to solidify to form an adhesive connection between the components and the second substrate. The first and second substrates are moved apart to transfer the components. At least a subset of the components is transferred from the second substrate to a third substrate by radiating light onto the adhesive layer to form a jet of melted material carrying the components.

14 Claims, 11 Drawing Sheets

(51) Int. Cl.
  *C09J 7/35* (2018.01)
  *H01L 25/075* (2006.01)
  *H10H 20/857* (2025.01)
  *H10H 20/01* (2025.01)

(52) U.S. Cl.
  CPC ........ *H10H 20/857* (2025.01); *C09J 2301/16* (2020.08); *C09J 2301/304* (2020.08); *C09J 2301/416* (2020.08); *C09J 2301/502* (2020.08); *H01L 2221/68354* (2013.01); *H01L 2221/68368* (2013.01); *H01L 2221/68381* (2013.01); *H10H 20/0364* (2025.01)

(56) References Cited

U.S. PATENT DOCUMENTS

| | | | |
|---|---|---|---|
| 2008/0122119 A1* | 5/2008 | Kian | H01L 21/6835 438/118 |
| 2017/0358478 A1 | 12/2017 | Thothadri et al. | |
| 2018/0323178 A1* | 11/2018 | Meitl | H01L 33/62 |
| 2018/0374738 A1* | 12/2018 | Lee | H01L 21/67288 |
| 2019/0081200 A1* | 3/2019 | Ting | H01L 24/81 |
| 2020/0023479 A1* | 1/2020 | Lin | H01L 21/68 |

FOREIGN PATENT DOCUMENTS

| | | | |
|---|---|---|---|
| CN | 109417065 B | | 5/2024 |
| JP | 2003007986 A | | 1/2003 |
| JP | 2004039938 A | | 2/2004 |
| JP | 2005174979 A | | 6/2005 |
| JP | 2007531321 A | | 11/2007 |
| KR | 20030029054 A | * | 4/2003 |
| WO | 2010/036305 A1 | | 4/2010 |
| WO | 2012/142177 A2 | | 10/2012 |
| WO | 2018/231344 A1 | | 12/2018 |

OTHER PUBLICATIONS

Japanese Patent Office, Notice of Reasons for Refusal in corresponding Japanese Patent Application No. 2021-569270 dated May 14, 2024.

China National Intellectual Property Administration, Office Action in corresponding Chinese Application No. 202080044099.9 dated Jan. 4, 2025.

China National Intellectual Property Administration, Second Office Action in corresponding Chinese Application No. 202080044099.9 dated Jul. 31, 2025.

* cited by examiner

LIGHT INDUCED SELECTIVE TRANSFER OF COMPONENTS BETWEEN SUBSTRATES

CROSS-REFERENCE TO RELATED APPLICATIONS

This patent application is a U.S. National Phase of PCT International Application No. PCT/NL2020/050324, filed May 20, 2020, which claims priority to European Application No. 19175621.2, filed May 21, 2019, which are both expressly incorporated by reference in their entireties, including any references contained therein.

TECHNICAL FIELD AND BACKGROUND

The present disclosure relates to a method and apparatus for light induced selective transfer of components between substrates.

Conventional pick-and-place is a good technology to assemble large number of millimeter sized components at low resolution alignment accuracies (100's um). Unfortunately conventional pick and place technology scales badly for higher throughput speeds (>100K units a second), of small components (<50 um) at high resolutions alignment accuracies (<2 um). So when large amounts of microscopic components need to be placed, this may be unsuitable. For example, micro-LED (µLED) displays are a candidate for future displays Due to their brightness, only a small area of the pixel area needs to be emissive for high brightness displays. In other words, a relatively low coverage is needed. So, even for relatively high display resolutions, e.g. around 70-600 pixels per inch (PPI), depending on the application, the LEDs can be of very small dimensions, e.g. less than 30 µm. But because µLEDs can be expensive to grow at high temperatures on expensive substrates such as sapphire, it is preferred that as much as possible of the wafer area is utilized for LED fabrication. Accordingly it is desired to selectively transfer components from a growth substrate to a product substrate with increased pitch (spacing) between the components.

For these and other reasons it is desired to improve assembly methodology of small components such as µLEDs, combining high resolution placement and accuracy with high throughput, e.g. for manufacturing displays or other devices.

SUMMARY

Various aspects of the present disclosure relate to methods and systems involved in light induced selective transfer of components. Components on a first substrate are contacted with an adhesive layer on a second substrate while the adhesive layer is (at least partially) melted by heat. The adhesive layer is then solidified to form an adhesive connection between the components and the second substrate. The first and second substrates are moved apart to transfer the components by the adhesive connection of the adhesive layer from the first substrate to the second substrate. Components from the second substrate may then be transferred to a third substrate, e.g. by radiating light onto adhesive regions holding the components.

By using a hot melt adhesive layer on the second substrate, the components can be easily transferred from a first substrate to a second substrate, and then to a third substrate using (selective) light induced forward transfer. This may be more versatile compared e.g. to pick and place methods. This may be particularly beneficial if the first substrate with components is unsuitable for light induced forward transfer. For example, the first substrate itself is unsuitable, e.g. opaque. For example, the connection of the components with the first substrate is not suitably affected by the light, or at least less suitable than the presently envisaged adhesive layer. Advantageously, the transfer by light melting the adhesive layer may additionally provide improved control over the transfer, e.g. compared to other methods of LIFT relying on dry ablation, blister formation, or mismatching thermal expansion coefficient.

By providing the third substrate with recesses, alignment can be improved for transfer of some of the components. Furthermore contact with protrusions on the third substrate may prevent inadvertent transfer of neighboring components. For example, the contact may physically block the transfer at those positions. For example, the contacting third substrate may act as a heat sink to at least partially diminish heating of the components at the contacting positions. The recesses may also further facilitate the transfer. For example, without contact to the third substrate, the components may be released from the second substrate and travel to the third substrate. It will be appreciated that the distance travelled can be well controlled by the defined points of contact and/or depth of the recesses. This may improve control over the transfer process. Furthermore, without the heat sinking effect of the contacting third substrate, the suspended components may be heated to a relatively higher temperature causing their release, e.g. by weakening of an adhesive or other reaction at their contact position.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
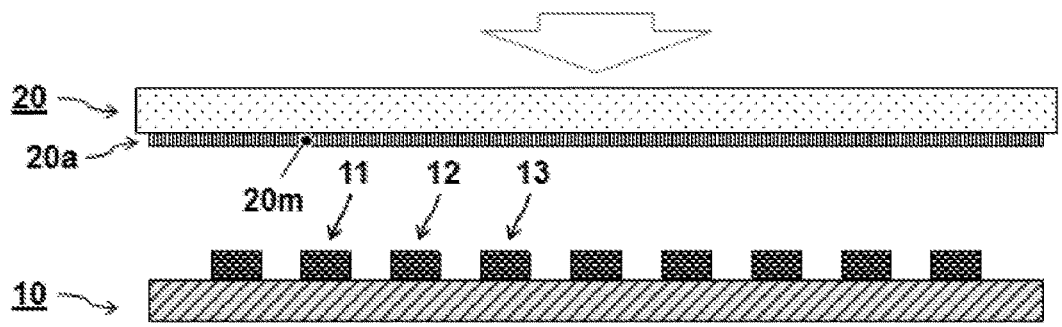
FIGS. 1A-1D illustrate transferring components from a first substrate to a second substrate, and transferring a first subset of the components from the second substrate to a third substrate.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

According to some aspects described herein, a contact and/or non-contact light induced transfer process is provided. For example, bare die chips, micro-LEDs, or other components can be transferred. In some embodiments, all components are first bonded from a wafer or blue tape onto a transparent carrier using a thin layer a hot melt adhesive. Subsequently the components are de-bonded from the blue tape or wafer using a mechanical or optical debonding method. The subsequent carrier may be placed underneath a laser system. By impinging a beam laser onto the component, a fast, selective and non-contact transfer of the components is achieved. In order to ensure that the components are not damaged, an optically dense hot melt can be used. This can be achieved by incorporating an additive to the hot melt layer. As a consequence the energy of the laser is dissipated in the hot melt, melting it and in the process transferring the component at relatively low speeds and high accuracies.

In some embodiments, the components (e.g. micro-LEDs, IC's) are delivered on a wafer or blue tape and transferred to a transparent carrier substrate. The carrier substrate is coated with a liquid (hot melt) adhesive. The layer of hot melt is brought into contact with the components on the wafer or blue tape. Re-heating the hot melt will melt it, e.g. so that the components become slightly immersed in the liquid. After cooling down, the components are fixed to the hot melt and the carrier with attached components can be separated from the wafer/blue tape by peeling or by first releasing the components, e.g. using a laser lift off process. For example, the carrier may be a substrate transparent to the laser, e.g. comprising borosilicate glass, quartz, or even sapphire. To enable further alignment of the micro components on the donor receptor, a number of alignment markers may be pre-patterned to facilitate the alignment process. In this case the wafer is aligned onto the glass carrier at high precision. The carrier with attached components can now be placed in the laser system for deposition. For example, the components are detached from the carrying substrate by application of a laser pulse to the back of the component. It will be appreciated that direct LIFT from the blue tape may typically be infeasible, e.g. when the layer thickness is too thick, its optical absorption is too high and/or it may result in an ablation process with high launch speed making accurate placement difficult. In the present case e.g. a scanning mirror or other light source allows to selectively transfer the components at a high throughput rate (e.g. 10-1000 KHz). For example, this can be reached by using either an x-y scanning mirror system, or a polygon scanning mirror system. For high density patterns, the polygon mirror system can reach higher throughput rates.

Some previous processes for light induced transfer may have relied on an ablation process of a dry adhesive at the component adhesive interface. This typically leads to very high launching speeds since there is a high energy required to reach the ablation threshold and consequently its difficult to align. The component may even bounce or be blown away by the formed gas. Alternatively previous processes may have relied on the formation of a bubble in PI due to ablation (LEAP). This is challenging to downscale, e.g. as the bubble geometry may not scale. Also adhering the components to PI is not easy. In process using a temperature expansion coefficient mismatch between acceptor and donor the laser may be directly impinging onto the components through a PDMS substrate. This could be unwanted as the laser may damage the component itself.

Conversely, the present described solution relies on a thermal process where the laser beam is not necessarily brought in contact with the component. Heating can be specifically directed to the hot melt from a solid to a liquid allowing a jet to be formed, stabilizing the component while it is slowly expelled from the donor. In other words, the present methods may use the melting of a hot melt instead of ablation to allow limiting the velocity of the component but also allow for the formation of a stabilizing jet. Compared to conventional pick-and-place, such laser process is orders of magnitude faster.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIGS. 1A-1D illustrate transferring components 11,12,13 from a first substrate 10 to a second substrate 20, and transferring a first subset 11 of the components from the second substrate 20 to a third substrate 30.

In some embodiments, e.g. as shown in FIG. 1A, a first substrate 10 is provided with the components 11,12,13. In one embodiments the first substrate 10 comprises an adhesive foil holding the components 11,12,13. For example, the first substrate 10 may be formed by a backing tape or dicing tape used during wafer dicing, i.e. the cutting apart of pieces of semiconductor material following wafer microfabrication. In another embodiment, the first substrate 10 may be formed by a wafer with components, e.g. the first substrate 10. In another or further embodiment, the first substrate 10 may itself act also as dicing tape.

In some embodiments, e.g. as shown in FIG. 1A, a second substrate 20 is provided with an adhesive layer 20a comprising an adhesive material 20m. Preferably, the adhesive material 20m comprises a hot melt adhesive. A hot melt adhesive (HMA), also referred to as hot glue, can be described as a form of thermoplastic adhesive that undergoes a phase transition, in particular melts, under the influence of elevated temperature. When the adhesive is melted, its adhesive strength may be significantly lowered, e.g. by a factor ten, twenty, fifty, hundred, or more, compared to its solid form. Melting of the adhesive may include or consist of an increase in viscosity of the material, e.g. by a factor of more than two, three, five, ten, twenty, fifty, hundred, or more (compared to the solidified adhesive). The melting may cause a wetting and/or flowing of the adhesive material, e.g. depending on temperature. In some embodiments, the adhesive layer may be melted to the point of wetting for forming an adhesive connection with components. In other or further embodiments, the adhesive may be melted to the point of flowing for transferring the components. Hot melt adhesives typically consist of a base material with various additives. For example, common base materials may include Ethylene-vinyl acetate (EVA) copolymers, Polyolefins (PO), Polyamides and polyesters, Polyurethanes, et cetera. For example, additives may include materials such as tackifiers, waxes, stabilizers, et cetera. The natures of the base material and the additives may influence the nature of the mutual molecular interaction and interaction with the substrate. The composition may be formulated to have a suitable glass transition temperature (onset of brittleness) below the lowest service temperature and melt temperature. The melt viscosity and the crystallization rate and corresponding open time can be tailored for the application.

Figure 1B:
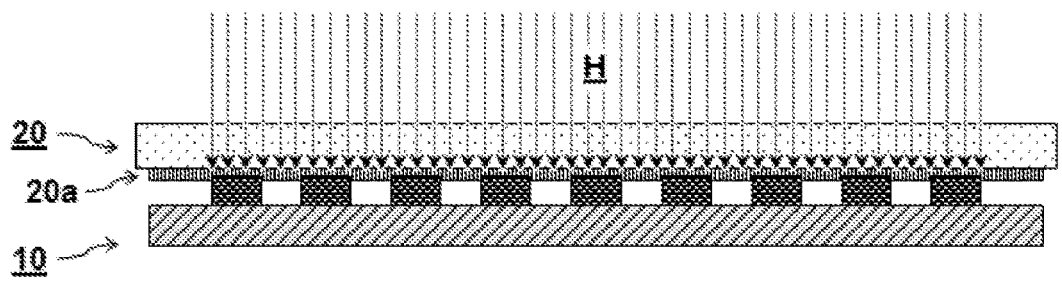

In some embodiments, e.g. as shown in FIG. 1B, the components 11,12,13 on the first substrate 10 are brought in contact with the adhesive layer 20a on the second substrate 20 while the adhesive layer 20a is (at least partially) melted by heat H. For example, the second substrate 20 is laminated onto the first substrate 10. For example, the adhesive layer 20a may be melted before and/or during contact with the components 11,12,13. In one embodiment, the heat H is provided by irradiating the adhesive layer 20a with light, e.g. through the second substrate 20 as shown, or from the side of the adhesive layer 20a (not shown), e.g. before the contact. The heat can also be provided in other ways, e.g. using an oven to heat the adhesive layer 20a before and/or during the contact.

In a preferred embodiment, the hot melt adhesive material has a melting temperature at least above room temperature, e.g. more than forty, fifty or sixty degrees Celsius so the adhesive can easily solidify when a source of heating is removed. On the other hand it may also be preferred that the melting temperature is not too high so the adhesive strength can be easily removed when needed, e.g. during transfer, and not damage the component. For example, the adhesive layer has a melting temperature less than two hundred fifty degrees Celsius, preferably, less than two hundred degrees, more preferably less than hundred-fifty degrees, e.g. between eighty and hundred-twenty degrees Celsius.

In some embodiments, the adhesive layer 20a is allowed to solidify to form an adhesive connection between the components 11,12,13 and the second substrate 20. For example, the solidification takes place after removing the heating (H) in FIG. 1B. For example, the adhesive layer 20a may be actively or passively cooled to below its melting and/or glass transition temperature.

Figure 1C:
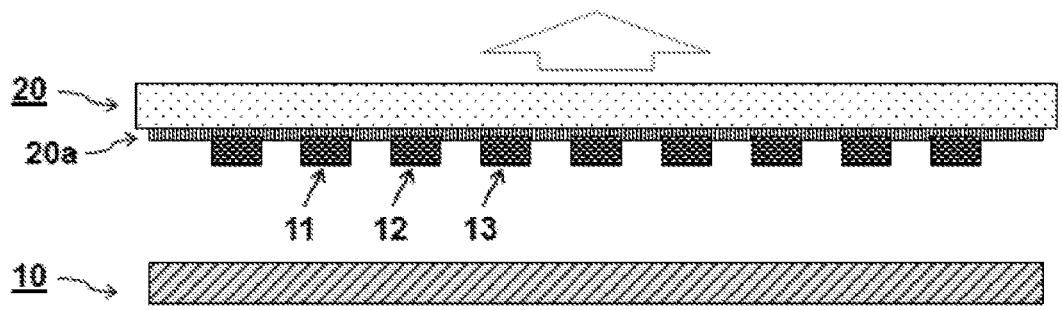

In some embodiments, e.g. as shown in FIG. 1C, the first and second substrates 10,20 are moved apart, e.g. delaminated, to transfer the components 11,12,13 by the adhesive connection of the adhesive layer 20a from the first substrate 10 to the second substrate 20. Preferably, the adhesive connection formed by the adhesive layer 20a between the components 11,12,13 and the second substrate 20 is stronger than any connection (adhesive or otherwise) the components 11,12,13 may have to the first substrate 10, e.g. stronger by at least a factor two, three, five, ten, or more. In some embodiments, the connection or adhesion of the components 11,12,13 to the first substrate 10 may be removed or lowered before the transfer. For example, a UV dicing tape can be used as the first substrate 10 wherein the adhesive bond is broken by exposure to UV light before the components are pulled off by the second substrate 20. It can also be envisaged to use another hot melt adhesive with a lower melting point so the adhesive layer on the first substrate 10 may still be melted while the adhesive layer 20a on the second substrate 20 is solidified. While the second substrate 20 is shown in the figures above the first substrate 10, this is not necessary. For example, the configuration of the first and second substrates can be flipped upside down, or sideways. Optionally the second substrate 20 can be flipped or positioned in any desired orientation after the transfer of the components from the first substrate 10, e.g. for subsequent steps as described in the following.

Figure 1D:
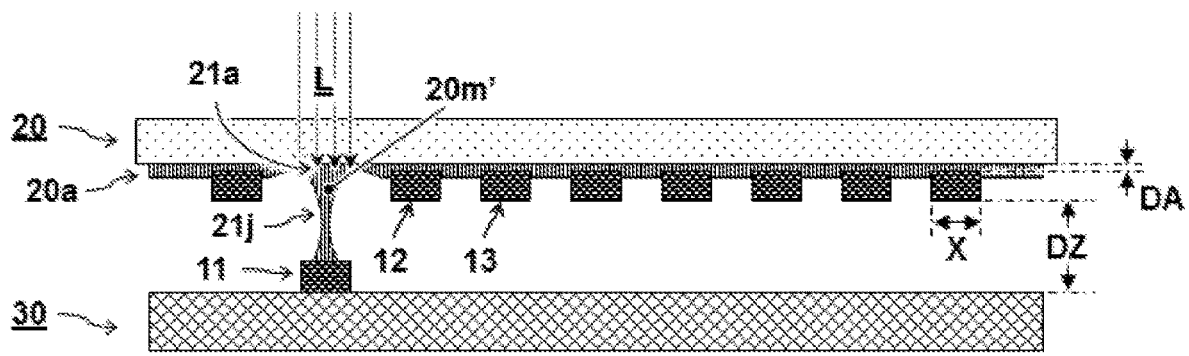

In some embodiments, e.g. as shown in FIG. 1D, at least a first subset of the components 11 is transferred from the second substrate 20 to a third substrate 30. Preferably, the transfer is initiated by radiating light L onto at least a first set of adhesive regions 21a of the adhesive layer 20a holding the at least first subset of components 11. Preferably, the second substrate 20 is transparent, at least for the light L which is used to release the components. In a preferred embodiment, e.g. as shown, the light L is directed through the second substrate 20, i.e. from the back of the components. Accordingly, the second substrate 20 is preferably transparent to the light L. For example, the second substrate 20 transmits most of the light, e.g. more than fifty, sixty, seventy, eighty, or even more than ninety percent. In another or further embodiment, the adhesive layer 20a is between the components and the light source. Most preferably, the adhesive layer 20a absorbs the light L. Alternatively, some of the light may be absorbed by the components which may also indirectly heat the adhesive. This latter mode of heating may be less preferred, e.g. in case the components are sensitive to heat.

In some embodiments, e.g. as shown, the light L is radiated exclusively onto a sub-region of the adhesive layer 20a. Accordingly, the adhesive layer 20a may be locally melted to release only the selected first subset of one or more components 11. In the embodiment shown, a single component is transferred at a time, e.g. using a directional laser beam. Alternatively, or in addition, multiple laser beams can be used to selectively transfer multiple components simultaneously. In a preferred embodiment (not shown), a mask is disposed between a light source, e.g. flash lamp, and the second substrate 20 to project a light pattern onto the adhesive layer 20a which simultaneously transfers a corresponding pattern of components. While some applications may benefit particularly from the option of selective light induced transfer of subsets of components, it can also be envisaged that all components are transferred to the third substrate 30.

In some embodiments, the light L may heat the adhesive material to a temperature where it starts to flow, e.g. taking the component along. Without being bound by theory, a direction of a resulting flow may be determined by the heating profile. For example, rapid heating of the adhesive material may cause a pressure wave. In a preferred embodiment, the light L is delivered a relatively short pulse for causing the heating and initiating the transfer. For example, the light pulse can be less than hundred milliseconds, less ten milliseconds, or even less than one millisecond. Using shorter pulsed may cause a sufficiently fast temperature rise before the heat has time to dissipate. In other or further embodiments, multiple pulses can be used or a longer pulse which continues to heat the adhesive material and/or component. In some embodiments, e.g. as shown, the light L causes at least the first set of adhesive regions 21a to melt and form one or more respective jets 21j of melted adhesive material 11m, wherein the at least first subset of components 11 is transferred to the third substrate 30 by the jets 21j extending from the second substrate 20 towards the third substrate 30.

Preferably, the hot melt adhesive layer or material has a relatively low viscosity when melted in a wetting phase to establish adhesion with the components, e.g. less than 1000 Pa·s (similar to peanut butter), preferably less than 500 Pa·s, more preferably less than 200 Pa·s, most preferably less than 100 Pa·s, typically more than 10 Pa·s. On the one hand, the viscosity is preferably low enough to allow establishing adhesion, e.g. allow the component to sink into the layer; and on the other hand high enough that the material does not start dripping from the substrate at this stage. The viscosity may be lower during the light induced transfer phase, e.g. less than 10 Pa·s (similar to honey), preferably less than 1 Pa·s, more preferably, less than 100 mPa·s, most preferably, less than 10 mPa·s, or even less than 1 mPa·s (similar to water). The lower the viscosity at this stage, the easier and/or faster the component may transfer between the substrates. Typically, the adhesive material may act as a non-Newtonian fluid, e.g. preferably shear thinning which may facilitate jet formation. When the material (re)solidifies, the viscosity may be increased, e.g. to more than $10^5$ Pa·s, more than $10^6$ Pa·s, and/or the material may effectively act as a solid.

In some embodiments, the one or more jets 21j may extend partially or completely (at least momentarily) between the adhesive layer 20a on the second substrate 20 and the components 11 on the third substrate 30. For example, a respective component 11 may be carried by a respective jet or droplet of melted adhesive material to the third substrate 30. This method of transfer by a melted jet may provide better control e.g. compared to (explosive) ablation of an adhesive layer. In other or further embodiments, the jet 21a of adhesive material may at least partially retract back to the adhesive layer 20a after the transfer. For example, the jet may break apart during or after the transfer. Some of the adhesive material may also be transferred together with the respective component and can optionally be cleaned off the component, if necessary.

In a preferred embodiment, e.g. as shown, the third substrate 30 is disposed below the second substrate 20 (along a gravitational vector) at least during the transfer of the first subset of components 11 there between. For example, the first subset of components 11 can be helped by a gravitational vector falling (in a non-contact manner) over some distance DZ towards the third substrate 30. Also other configurations can be envisaged, e.g. the third substrate 30 can be on the top and the second substrate 20 on the bottom, or the substrates can face each other sideways. For example, the jets or droplets may carry the components in any direction, e.g. depending on momentum created by (sudden) heating of the light.

In some embodiments, during the transfer by radiating light L, a (non-zero) distance DZ between the components 11,12,13 on the second substrate 20 and their destination surface on the third substrate 30 is less than twice a (largest) cross-section diameter X of the components 11,12,13. For example, the distance DZ is between five percent (factor 0.05) and two-hundred percent (factor two) the diameter X of the component (in plane with the substrate), preferably between twenty and hundred percent, more preferably between thirty and fifty percent. Within such ranges, the component placement can be relatively accurate while still having sufficient distance to completely transfer, allowing the jet to break apart, and prevent inadvertent contact of the non-transferred components 12,13 with the third substrate 30. For example, a component with a cross-section size of 350 µm can be transferred over a gap size between about 20 µm and 500 µm.

In some embodiments, the adhesive layer 20a is configured to (directly) absorb a relatively high percentage of the light L before it reaches the component. In this way the energy is at least initially dissipated directly in the adhesive for causing the melting, and overheating of the component may be alleviated. In a preferred embodiment, the adhesive layer 20a is configured to absorb at least ten percent of the light L, preferably at least thirty percent, more preferably at least fifty percent, or even more than eighty or ninety percent. The more light is directly absorbed by the layer, the better the component may be protected from damage.

In some embodiments, a layer thickness DA of the adhesive layer 20a between the components 11,12,13 and a source of the light L is set to achieve a desired light absorption. For example, the layer thickness DA is more than ten micrometers, more than twenty micrometers, more than fifty micrometers, more than hundred micrometers, or more, e.g. up to one or two millimeters, depending on the application. For example, the layer thickness DA may be the same or similar as a thickness of the components e.g. a factor 0.1-10 times this thickness. The layer thickness may also determine an amount of material which may flow with the component during transfer. The original layer thickness of the adhesive layer can be more than the thickness DA of the material between the component and light source, e.g. if the components are partially sunken into the adhesive layer.

In some embodiments, an absorption coefficient of the adhesive layer 20a for the light L is relatively high. In some embodiments, the hot melt adhesive material may be transparent by itself. To increase absorption a dye or absorber can be added to absorb at the wavelength of the light L. For example, TiO2 can be added for a 355 nm UV laser. Since the process may be predominantly thermally driven and not ablation based, different absorbers can be considered for different types of lasers. E.g. a green laser could be used in combination with Rodamine absorber or an NIR laser 1064 with a NIR absorbing dye such as the Epolight 9837. Since the process is expected to be predominantly thermally driven and not ablation based, different absorbers can be considered for different types of lasers. E.g. a green laser could be used in combination with Rodamine absorber or an NIR laser 1064 with a NIR absorbing dye such as the Epolight 9837.

Figure 2A:
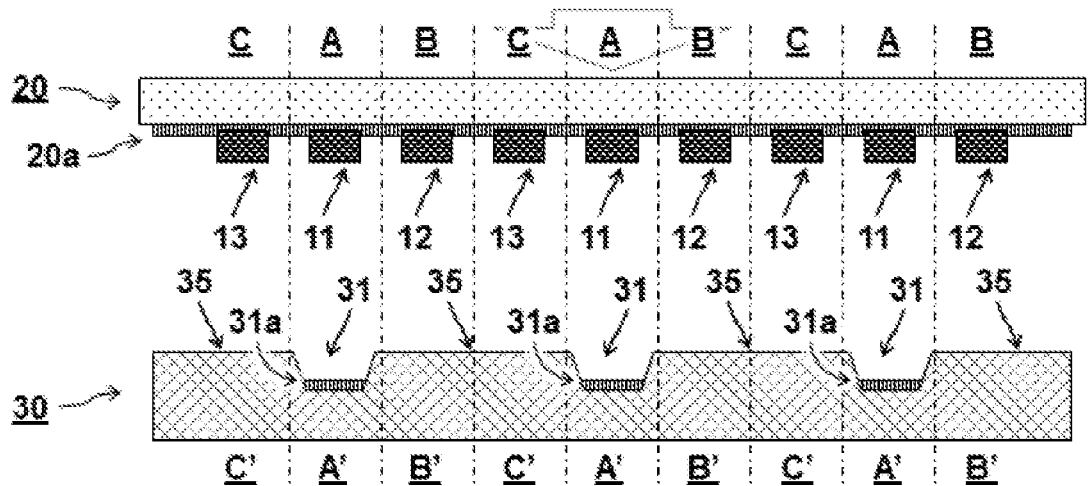
FIGS. 2A-2C illustrate transferring components into recesses of a third substrate.
Figure 2B:
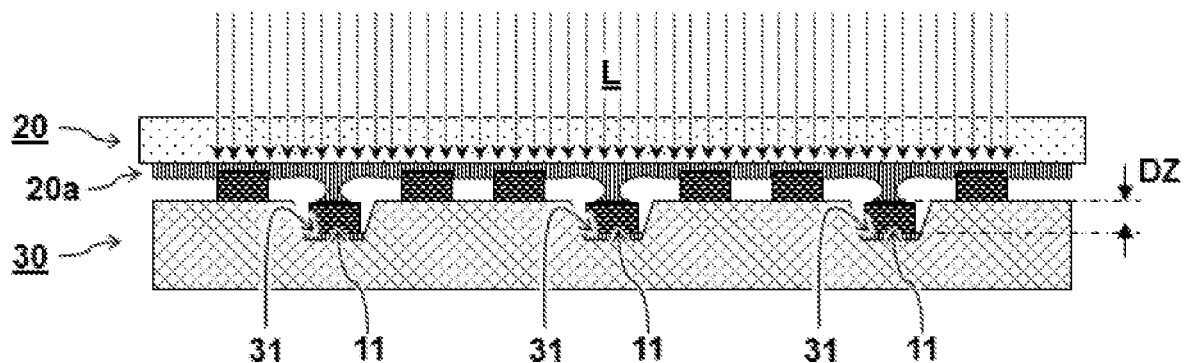
Figure 2C:
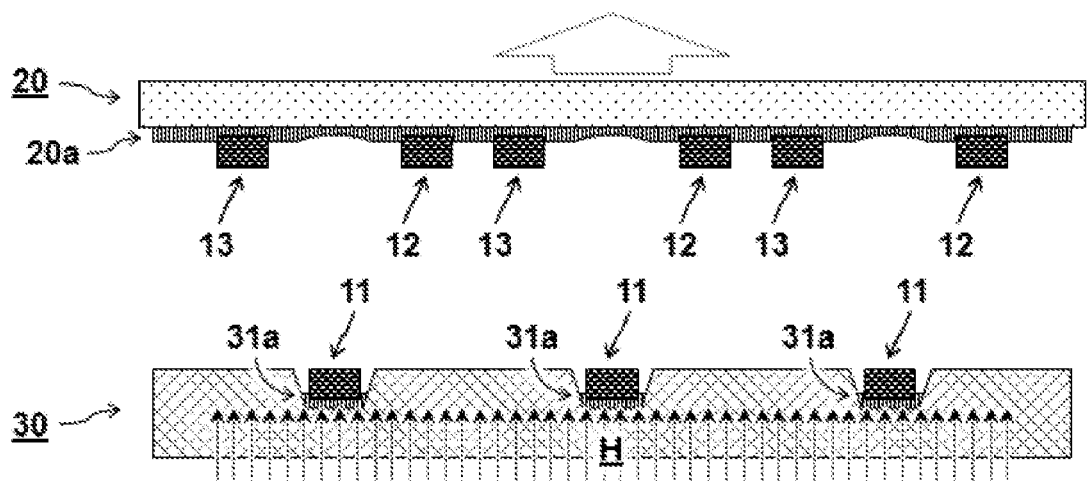

FIGS. 2A-2C illustrate the third substrate 30 is provided with recesses 31 for receiving the transferred components 10. For example, the accuracy of component placement may be improved by this or other adaptation of the third substrate 30.

In some embodiments, e.g. as shown in FIG. 2A, the first subset of components 11 is arranged according to a first component layout A on the second substrate 20. In another or further embodiment, the third substrate 30 comprises recesses 31 disposed at least at relative positions A' corresponding to the first component layout A. In some embodiments, e.g. as shown in FIG. 2B, the second and third substrates 10,20 are aligned to have the first subset of components 11 suspended over the corresponding recesses 31 without contacting the third substrate 30. In other or further embodiments, the light L is projected onto at least the first component layout A on the second substrate 20 to transfer the first subset of components 11 across and into the corresponding recesses 31 of the third substrate 30. In some embodiments, e.g. as shown in FIG. 2C, the substrates may be moved apart after the transfer.

In some embodiments, e.g. as shown, the components 11,12,13 on the second substrate 20 are divided in different, e.g. exclusive, subsets including a second subset of components 12 arranged according to a second component layout B. In other or further embodiments, the third substrate 30 comprises protrusions 35 formed by non-recessed areas of the third substrate 30 disposed at least at relative positions B' corresponding to the second component layout B. In one embodiment, in the aligning the second and third substrates 10,20 the second subset of components 12 is in contact with the corresponding protrusions 35 of the third substrate 30. In another or further embodiment, after the transfer of the first subset of components 11, the second subset of components 12 remains attached to the second substrate 20.

In some embodiments, a first subset of components 11 is selected for transfer during a first component transfer and arranged according to a first component layout "A". In the embodiment shown, a second subset of components 12 is selected to remain on the second substrate 20 during the first component transfer and arranged according to a second component layout "B". Also further subsets may be defined, e.g. in the shown embodiment the third subset of components 13 is arranged according to a layout "C", which in this case is also selected to remain on the second substrate during the first component transfer. Of course the remaining components 12 and 13 can also be considered as part of a single layout in this regard.

In a preferred embodiment, a third substrate 30 comprises recesses 31 disposed at least at relative positions A' corresponding to the first component layout "A". In other words, the distances between the recesses 31 correspond to the distances between the first subset of components 11. Also the sizes, e.g. diameters, of the recesses 31 correspond to the sizes of the components 11, so that they fit in the recesses as further explained below. The concept of a recess as used herein generally refers to a concavity or an area of the third substrate 30 whose level is below the average surface level of the third substrate 30.

In a preferred embodiment, the third substrate 30 comprises protrusions 35. The protrusions 35 are disposed at least at relative positions B' corresponding to the second component layout "B". In other words the distances between the dimensions of the protrusions 35 correspond with those of the second subset of components 12 (and third subset of components 13 in this case). For example, protrusions can be formed by non-recessed areas of the third substrate 30, or otherwise. The concept of a protrusion as used herein generally refers to a convexity or an area of the third substrate 30 whose level is above the average surface level of the third substrate 30. Protrusions on the surface of the third substrate 30 may define recesses there between and/or vice versa.

In one embodiment, e.g. as shown in FIG. 2B, the second and third substrates 10,20 are aligned, i.e. relatively positioned. In the embodiment shown, the first subset of components 11 is suspended over the corresponding recesses 31 without contacting the third substrate 30. Furthermore, as shown, (at least) the second subset of components 12 is preferably in contact with the corresponding protrusions 35 of the third substrate 30.

In some embodiments, light "L" is projected, e.g. in a first component transfer, onto at least the first component layout "A" on the second substrate 20. Preferably, the second substrate 20 is transparent to the light "L" so that the light can shine through the second substrate 20 to illuminate the adhesive layer 20a and/or components 11 from the back. Alternatively, or in addition, light may also shine from other directions, e.g. heating the components which in turn heat an area of the second substrate, or layer there between, for release. In the embodiment shown, the light causes all of the first subset of components 11 to be deposited or transferred across and into the corresponding recesses 31. At the same time (at least) the second subset of components 12 can remain attached to the second substrate 20. In the embodiment shown, also the third subset of components 13 remains on the second substrate 20. It will be appreciated that the contact with the corresponding protrusions 35 may prevent transfer of the second subset of components 12 in the first component transfer (and also the components 13 here). For example, the contact physically blocks the transfer.

In the embodiment shown, at least some of the light "L" is also projected onto the second component layout "B". For example, the whole second substrate 20 or a significant area thereof may be illuminated. In another or further embodiment (not shown here), the light can also be patterned e.g. to selectively or exclusively illuminate the first subset of components 11. Also in that case, the present methods can be advantageous e.g. in preventing inadvertent transfer of nearby components which can be indirectly heated via the second substrate 20, especially when the components and distances there between are in a micrometer regime.

In some embodiments (not shown), the second subset of components 12 is selected for transfer during a second component transfer. The second component transfer can be separate from the first component transfer, e.g. takes place at different instances of time and/or place. For example, the second component transfer comprises aligning the second substrate 20 with the remaining second subset of components 12 over a third substrate (not shown) comprising recesses disposed at least at relative positions corresponding to the second component layout "B". In some such embodiments, the third substrate for the second component transfer is another substrate with other recesses. In other such embodiments, the same substrate is used in the second component transfer, e.g. comprising additional recesses not used in the first component transfer. For example, in the second component transfer, light is projected onto at least the second component layout on the second substrate to transfer the second subset of components 12 components across and into the corresponding recesses.

In the embodiment shown, the plurality of components includes a third subset of components 13 e.g. components selected to remain on the second substrate 20 during both a first and second component transfer (not shown). In the embodiment, the third subset of components 13 is arranged according to a third component layout C. For example, the third substrate for transfer in the second component transfer comprises protrusions disposed at least at relative positions corresponding to the third component layout C for contacting the third subset of components 13 during the second component transfer. For example, the third subset of components 13 is selected for transfer during a third transfer step (not shown). Of course the components may also be divided in only two subsets, or divided into more than three subsets of components, e.g. four, five, ten, or more subsets.

In general, different subsets of the components can be transferred in different transfer steps into different recesses on the same or different third substrates. Preferably, each transfer step is effected by a separate (single) pulse of light "L" or a separate sequence of pulses. Alternatively, a continuous light source could be used in principle.

In some embodiments, components of first subset of components 11 are interspersed with components of the second subset of components 12 on the second substrate 20. Accordingly, the density of components on the second substrate 20 can be relatively high compared to the density on the third substrate 30. In the embodiment shown, the components 12 in the second subset have the same relative positions as the components 11 in the first subset. In other words, the second component layout "B" is the same but shifted as the first component layout "A". This may have an advantage that the same target layout of recesses can be filled with either of the component layouts "A" or "B". For example, a first third substrate with recesses is filled with the first subset of components 11 and a second third substrate with identical recess layout is filled with the second subset of components 12.

In the embodiment shown, the components 12 of the second subset are (directly) neighboring the components 11 of the first subset on the second substrate 20. It will be appreciated that particularly for such neighboring components it may be difficult to control localized heat deposition in the second substrate 20, especially for small components and/or high densities. Accordingly the present methods and systems may prevent inadvertent transfer of such neighboring components.

In some embodiments (not illustrated here), components are transferred onto a circuit for connection therewith. For example, solder material or conductive adhesive is disposed on the third substrate to connect the component with the circuit, e.g. electrodes. Alternatively, or in addition, solder or other material may be disposed underneath the components on the second substrate and transferred together with the components. Soldering or other types of connections can be performed in one step, in some embodiments. For example, the heat from the light may cause both transfer and soldering. Alternatively, or in addition, the components may also be connected to a circuits after transfer. In some embodiments, the components comprise one or more electrical connections on top, i.e. facing away from the third substrate. For example, a connection can be made to such component by depositing, e.g. printing, an electrode on top of the third substrate advantageously connecting to the top. It will be appreciated that the recessed components can be more easily connected to the top from an adjacent (relatively raised) level of the third substrate which can be flush with the component in some embodiments. Also connections to the side of the component may be envisaged. It will be appreciated that side connections may be further facilitated by providing the recess with sloped edges.

Figure 3A:
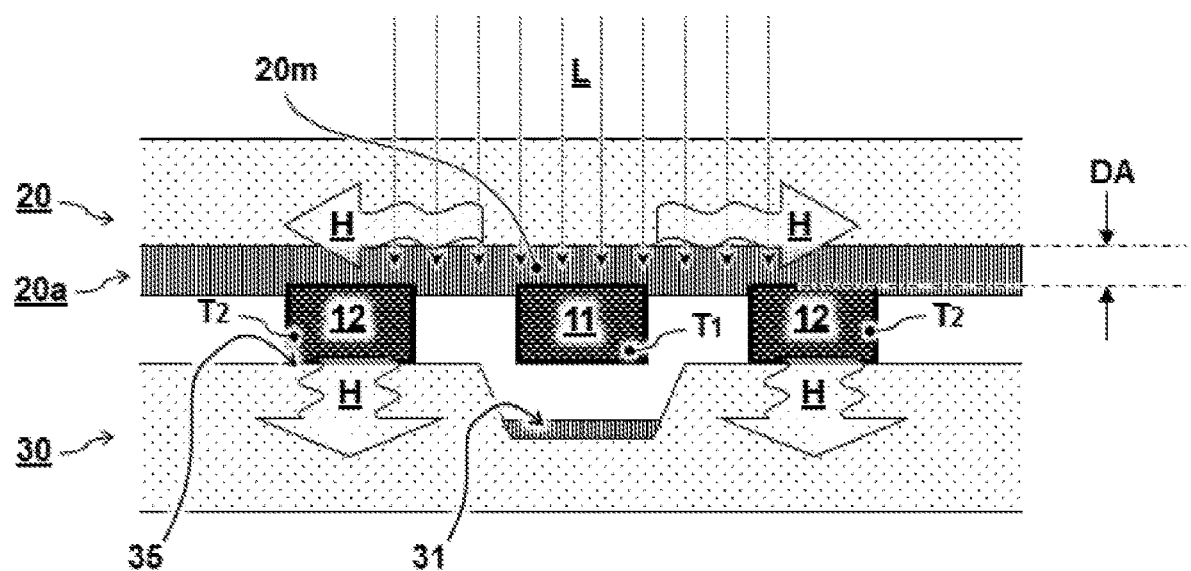
FIGS. 3A and 3B illustrate a flow of heat according to some embodiments.
Figure 3B:
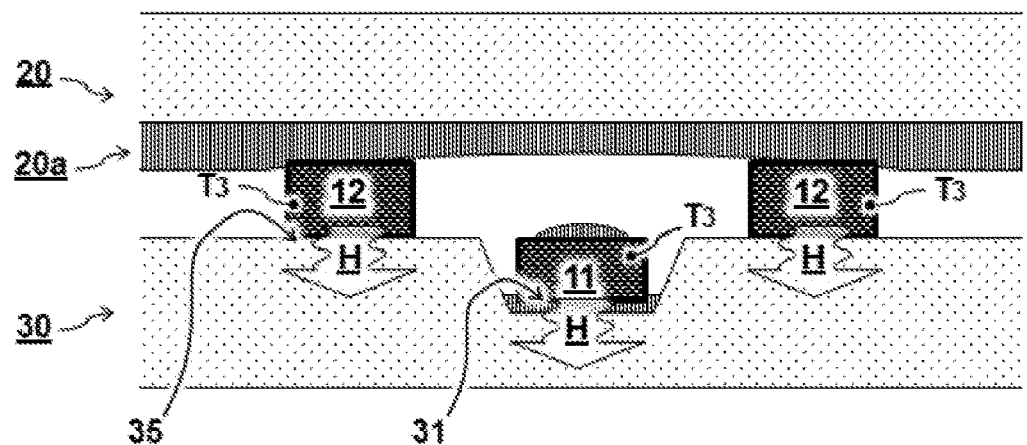

FIGS. 3A and 3B illustrate a flow of heat H according to some embodiments. In some embodiments, e.g. as shown, it may be difficult or impractical to limit an extent of the heating to the designated component 11 for transfer. For example, the components (e.g. micro-LEDs) and/or the distance between them can be relatively small. Accordingly, the heat H may spread also to neighboring components 12 which are supposed to remain on the substrate. It will be appreciated that the contacting protrusions on the third substrate may effectively keep the neighboring components 12 in contact with the adhesive layer 20a even if it (partially) melts. Furthermore, the contact may allow heat to be better dissipated for the neighboring components 12 than the component to be transferred 11. After the transfer, as shown in FIG. 3B, the adhesive layer and/or components may cool down to re-solidify the adhesive layer 20a and the neighboring components 12 can re-adhere to the second substrate 20.

In some embodiments, the contacting third substrate 30 can act as a heat sink for the second subset of components 12. For example, a significant fraction of heat generated by the light, e.g. pulse, is dissipated through the contact with the third substrate 30, e.g. more than twenty percent, more fifty percent, or even more than eighty or ninety percent. This may be useful, in case at least some of the light "L" impinges at the second subset of components 12, e.g. directly heating the second subset of components 12. Alternatively, or in addition, it may be useful in case at least some of the light "L" impinges near the second subset of components 12, e.g. indirectly heating the second subset of components 12 via the second substrate 20.

In the embodiment shown, the light "L" causes the first subset of components 11 to be heated to a first temperature T1 and the second subset of components 12 to a second temperature T2. By the measures described herein, it may occurs that the second temperature T2 is lower than the first temperature T1. Preferably, the first temperature T1 is above a threshold for releasing the first subset of components 11 from the second substrate 20. In some embodiments, the adhesive layer 20a between the second substrate 20 and the first subset of components 11 is weakened to release the first subset of components 11. In other or further embodiments, an adhesive between the second substrate 20 and the second subset of components 12 is not sufficiently weakened to release the second subset of components 12. Alternatively, or additionally, the adhesive may cool down after the light "L" is gone and its adhesive strength is restored while the second subset of components 12 still contact the second substrate 20.

In some embodiments it is preferred that the third substrate 30 has a relatively high heat conduction coefficient at least at the contacting interface. For example, the heat conduction coefficient and/or heat capacity of the third substrate 30 is relatively high compared to the heat conduction coefficient and/or heat capacity of the second substrate 20, e.g. ten percent higher or more, e.g. twice as much. Providing the second substrate 20 with a relatively low heat conduction coefficient can also provide further benefits of lowering sideway conduction of heat H and/or facilitating heating of the components 11.

Figure 4A:
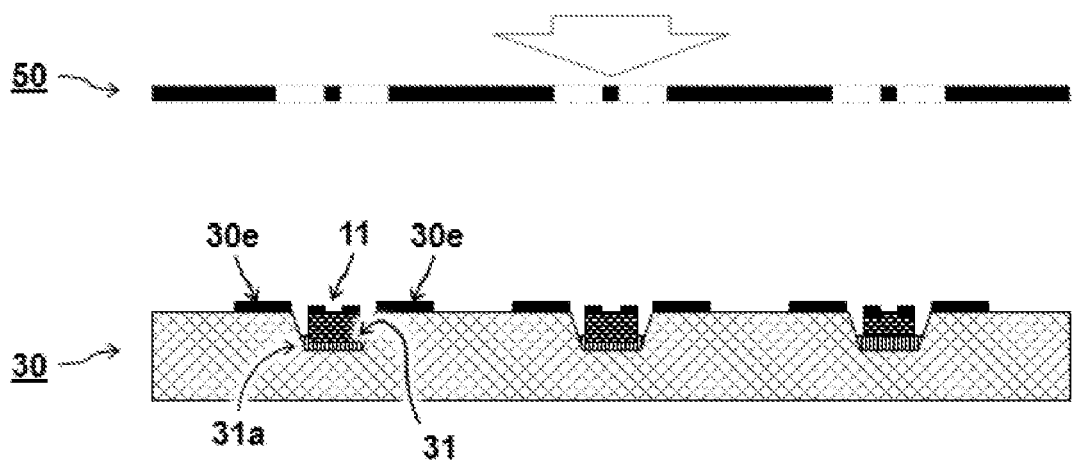
FIGS. 4A-4C illustrate electrically connecting components to the third substrate.
Figure 4B:
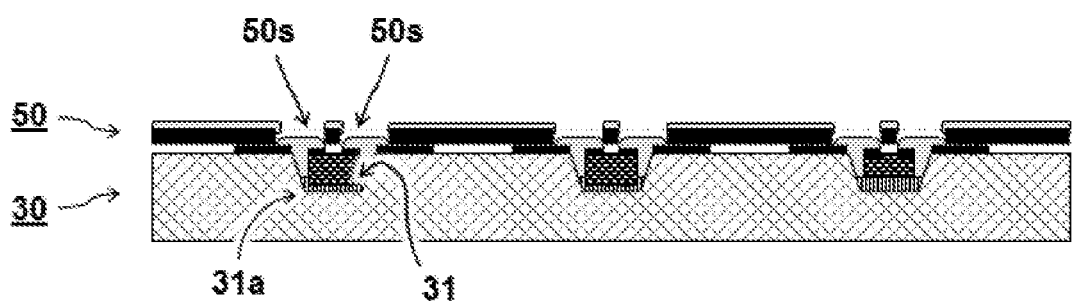
Figure 4C:
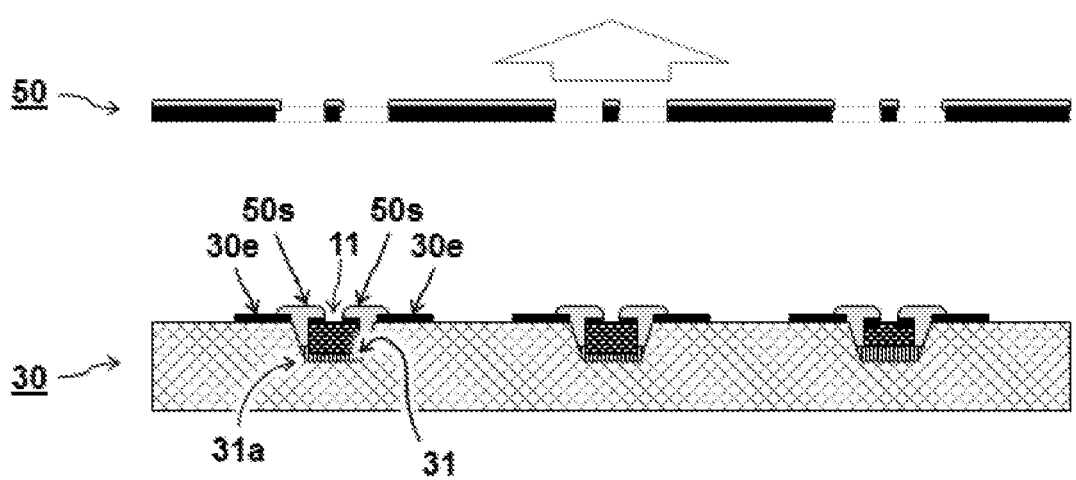

FIGS. 4A-4C illustrate electrically connecting components 11 to the third substrate 30.

In some embodiments, e.g. as shown, an electrically conductive material 50s is applied to the components 11 while the components 11 are disposed on the third substrate 30. In some embodiments, the components have electrical input/output connections on the top, i.e. facing away from the third substrate 30 and the conductive material 50s can be applied also on top. For example, the components may comprise micro-LEDs configured to direct light to the other side through the third substrate 30. In other or further embodiments, the component connections can be at the side and/or at the bottom. In some embodiments, a solder or other material can be applied to the component connections, which can help to establish an electrical connection to electrodes 30e of a circuit on the third substrate 30, as shown here; or to another substrate, as shown later. For example, the third substrate 30 may be a final substrate, e.g. used in an end product; or used as an intermediate (template) substrate for subsequent transfer.

In some embodiments, e.g. as shown, the recesses 31 and/or protrusions 35 comprise one or more electrodes 30e to form respective electrical connections with the transferred components 11. While the conductive material 50s can be applied to components on a substrate without recesses (not shown) or electrodes 30e, it will be appreciated that having the components 10 in respective recesses 31 may help in applying the conductive material 50s and/or establishing electrical connections with the electrodes 30e. For example, the components can be at least partially, or fully sunken into the recesses 31, or flush with the surface of the protrusions.

In some embodiments, e.g. as shown, a screen 50 is used with respective openings matching positions where the conductive material 50s is to be applied. For example, the openings are aligned with the recesses or other component positions before applying the conductive material 50s. For example, a screen printing or similar process can be used to easily apply the conductive material 50s.

In some embodiments, e.g. as shown, the third substrate 30, or at least the recesses 31 are provided with an adhesive layer 31a to hold the transferred components in the recesses. For example, the third substrate 30 (also) comprises a hot melt adhesive layer 31a to hold the components 11 after transfer. In some embodiments, the adhesive layer 31a on the third substrate 30 may be melted before the transfer. In other or further embodiments, the adhesive layer 31a may melt as a result of receiving a component with still elevated temperature dissipating its heat. In other or further embodiments, the adhesive layer 31a may be melted by applying heat during and/or after the transfer. Alternative to a hot melt adhesive, also other types of adhesive can be used for the adhesive layer 31a, or the adhesive layer 31a can be omitted, e.g. if the subsequent electrical connections are sufficient, or the components are picked up in a subsequent step.

In some embodiments, the adhesive layer 31a (hot melt or otherwise) may help to hold the components during and/or after establishing the electrical connections. In other or further embodiments, e.g. wherein the adhesive layer 31a is a hot melt adhesive or other layer suitable for subsequent (light induced) transfer, the components 11 can be transferred to yet another substrate as will be described later.

Figure 5A:
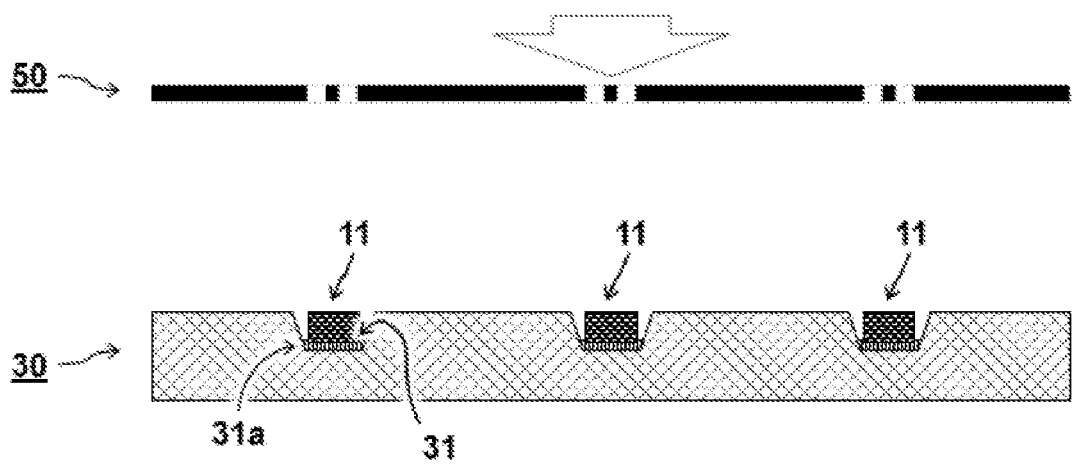
FIGS. 5A-5C illustrate preparing the components on the third substrate for further transfer.
Figure 5B:
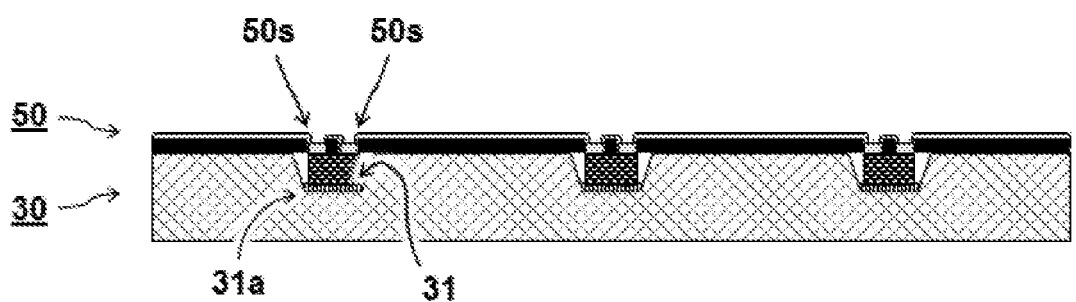
Figure 5C:
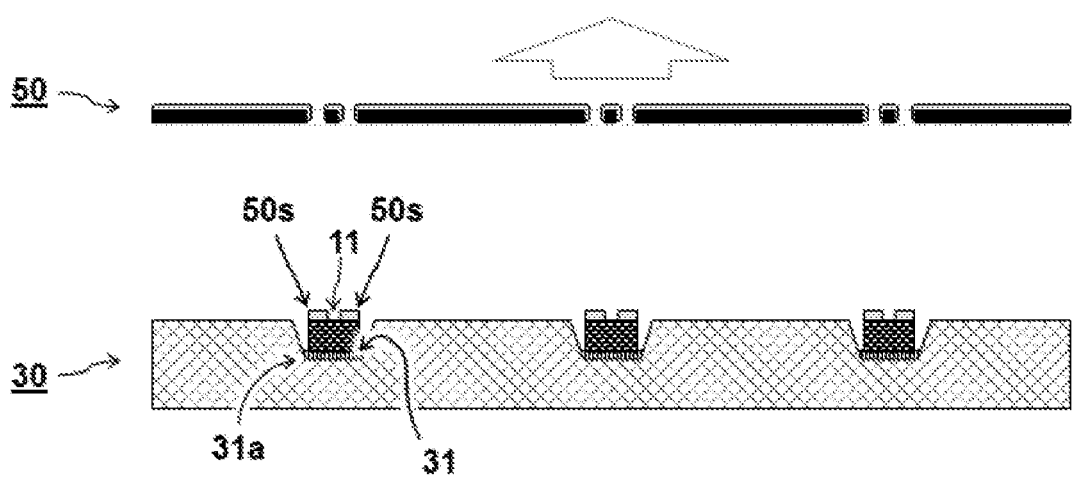

FIGS. 5A-5C illustrate preparing the components 11 on the third substrate 30 for further transfer. In some embodiments, an electrically conductive material is applied to the components 11 (in recesses or otherwise) before the components are transferred from the third substrate 30 to a fourth substrate (not shown here). For example, a solder material can be applied which may be melted during or after the subsequent transfer. The process of applying the conductive material may otherwise be similar as explained above, e.g. using screen printing.

Figure 6A:
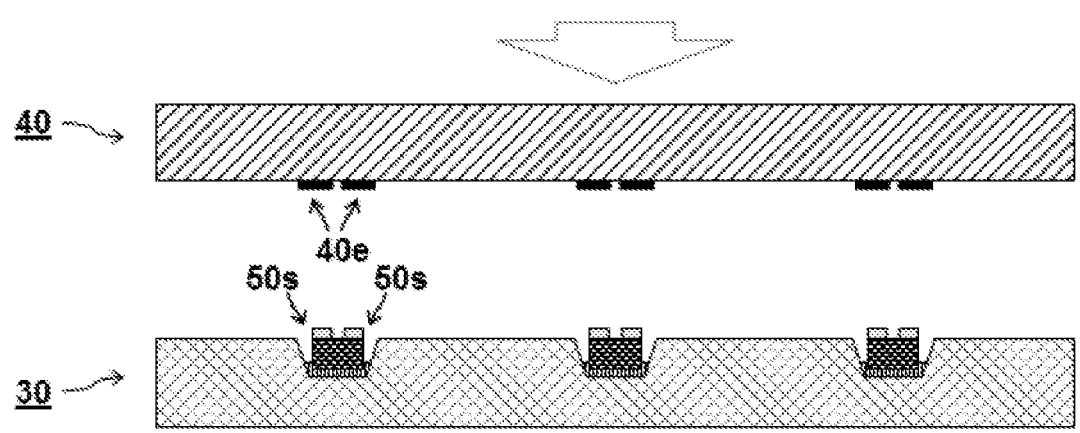
FIGS. 6A-6C illustrate transferring the components to a fourth substrate.
Figure 6B:
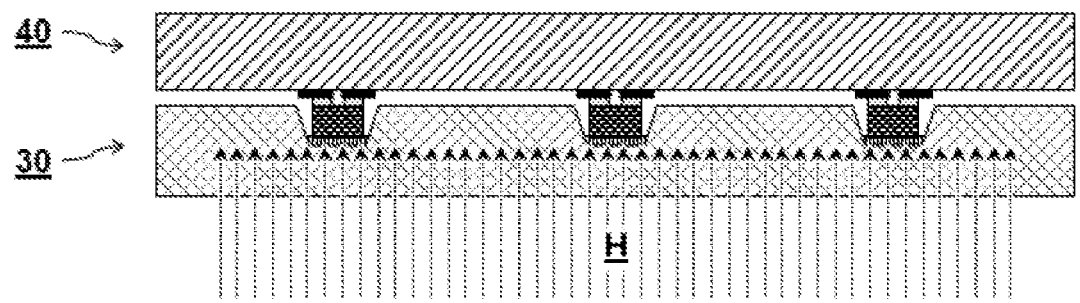
Figure 6C:
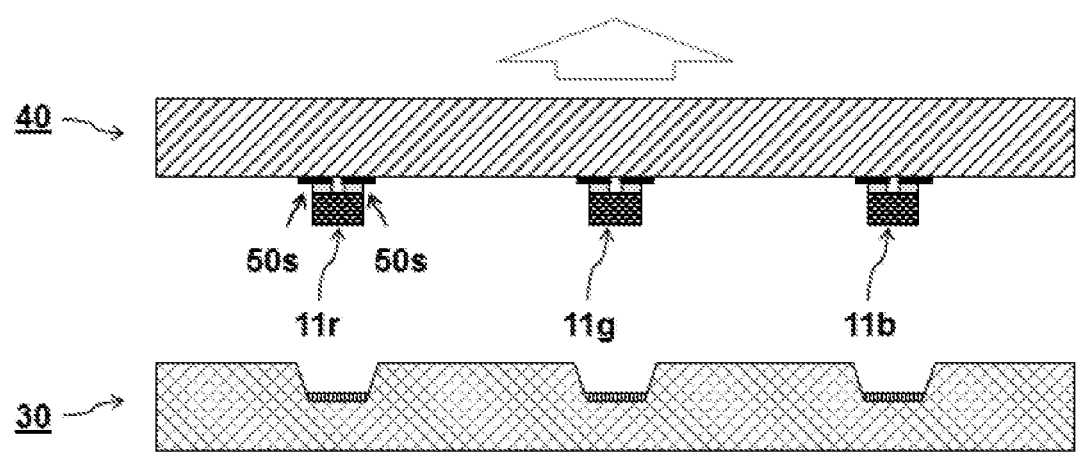

FIGS. 6A-6C illustrate transferring the components 11r, 11g, 11b to a fourth substrate 40. The components may all be the same, or different components, e.g. red, green, and blue (micro)LEDs arranged in a predetermined configuration on the third substrate 30.

In some embodiments, e.g. as shown, the components may be picked up by the fourth substrate 40. In other or further embodiments, the components may be adhered by the conductive material 50s to electrodes 40e on the fourth substrate. For example, adhesion of the conductive material 50s is activated while contacting the electrodes 40e. Advantageously, the third substrate 30 need not be flipped to transfer the components 11, so optionally, they need not be adhered to the third substrate 30, e.g. only held by the recesses 31.

In some embodiments, heating H may be applied, e.g. to melt a solder or other conductive material 50s. In other or further embodiments, the heating may lower or remove adhesion to the third substrate 30, e.g. in case a hot melt or similar adhesive is used. It will be appreciated that picking up components can be relatively easy by virtue of their presence in recesses 31, as shown. Alternatively, components can also be picked up from non-recessed areas. While the present embodiment shows all components 11 on the third substrate 30 being transferred to the fourth substrate 40, it can also be envisaged to selectively transfer a subset of the components to the fourth substrate.

Figure 7A:
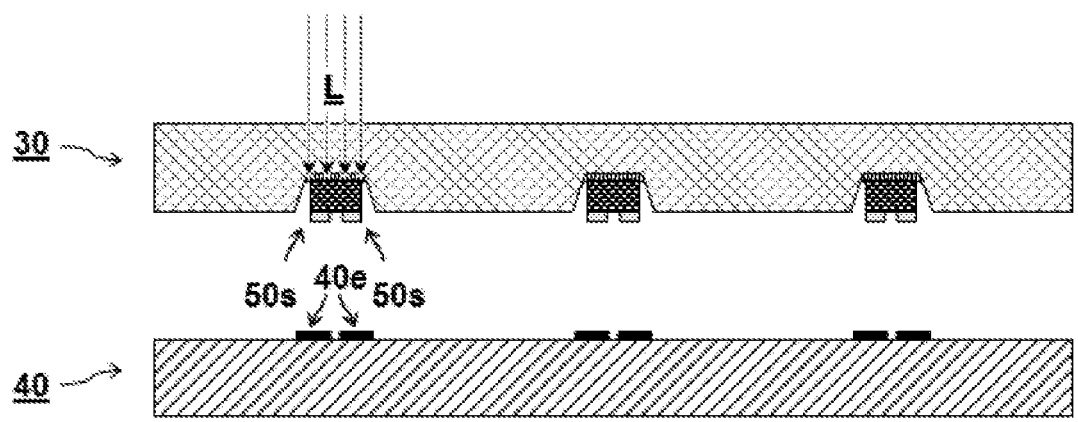
FIGS. 7A-7C illustrate transfer between the third and fourth substrates using light.
Figure 7B:
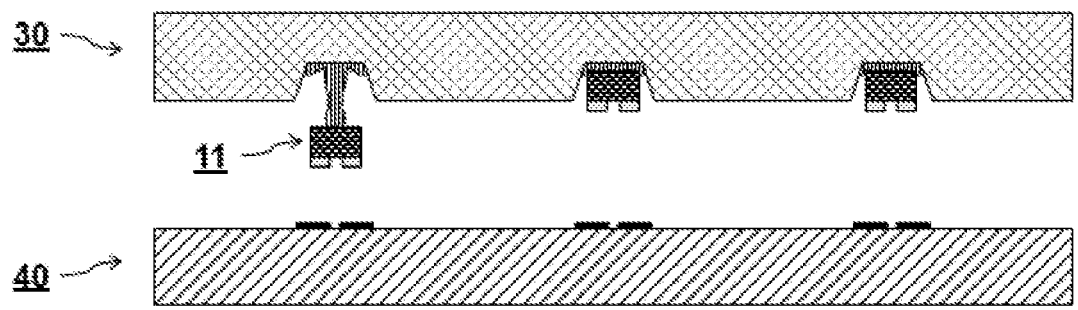
Figure 7C:
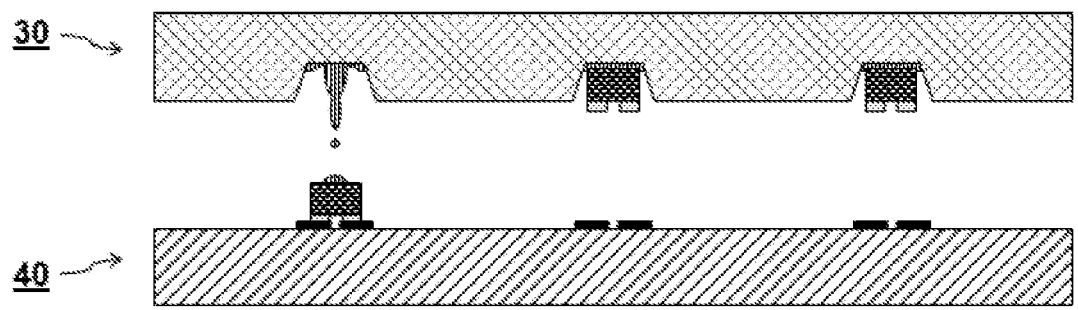

FIGS. 7A-7C illustrate transfer between the third and fourth substrates 30,40 using light L.

In some embodiments, e.g. as shown, components are transferred selectively from the third substrate 30 to the fourth substrate 40, e.g. using selective illumination by light L. In some embodiments, each of the components is transferred to the fourth substrate, e.g. sequentially or simultaneously. In other embodiments, only a subset of components is transferred. So it will be understood that in principle each transfer step between the first, second, third, and fourth substrates, may include the transfer of all, or a subset of components. Preferably, the transfer of the first to the second substrate, and from the third to the fourth substrate includes transfer of all components; while only a subset of components is transferred between the second and third substrate. This allows, e.g. to decrease a density of components and/or combine different components on the third substrate by selective transfer using light while the components can be simultaneously transferred to a final substrate in a desired configuration.

In a preferred embodiment, the solder or other conductive material 50s for electrically connecting the components to a respective substrate 30,40 is melted by the same light pulse L as used for transferring the components 11. For example, a single light pulse can be used to heat the adhesive material and/or component for initiating the transfer, wherein that heat also causes the conductive material 50s to melt before or after arriving at the destination substrate. Alternatively, different light pulses can be used, or the conductive material 50s can be heated or otherwise activated in another way.

In some embodiments, the third substrate 30 with recesses 31 is re-used after transferring some or all of the components 11 to one or more further substrates 40. For example, the third substrate 30 may act as a re-usable template with a predefined geometry of recesses to repeatedly manufacture a respective product. Optionally, the adhesive material, e.g. hot melt, can be also be re-used, or applied again between re-use.

Figure 8A:
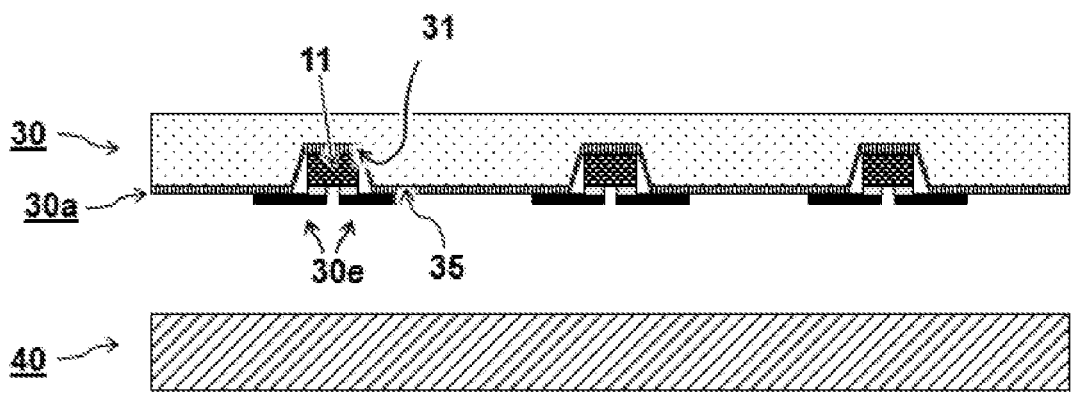
FIGS. 8A-8C illustrate transferring the components together with an electrical circuit.
Figure 8B:
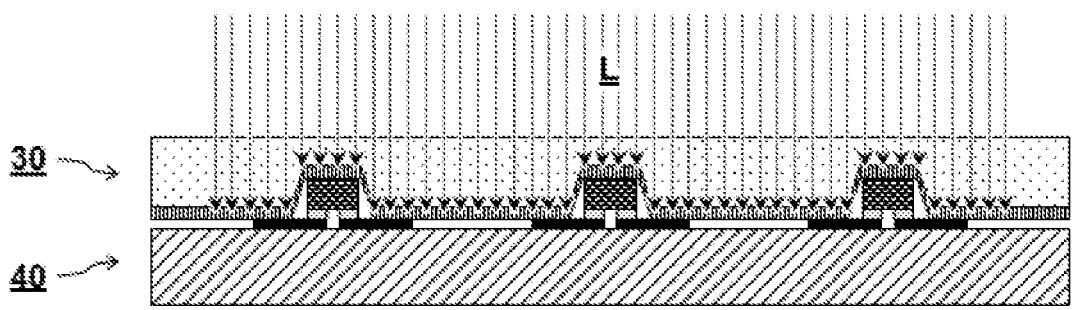
Figure 8C:
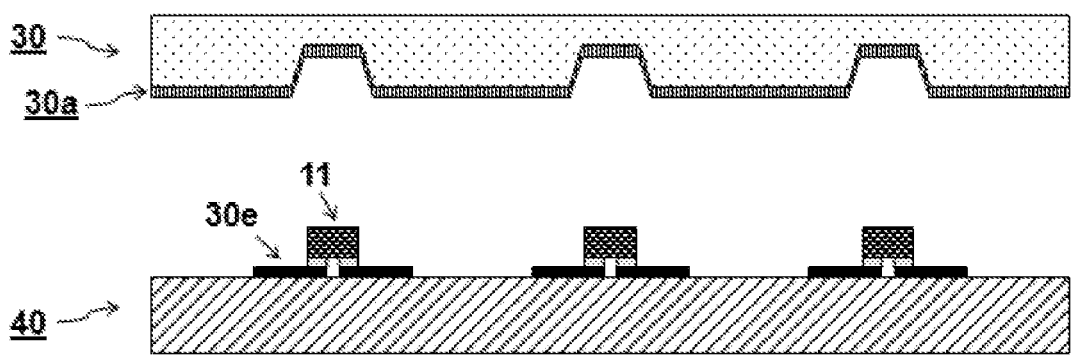

FIGS. 8A-8C illustrate transferring components 11 together with an electrical circuit.

In some embodiments, the third substrate 30 comprises a hot melt adhesive layer 30a. In one embodiment, as shown, the components 11 are held by regions of the adhesive layer 30a in respective recesses 31 of the third substrate 30. In another or further embodiment, as shown, electric circuit parts 30e connected to the components 11 are held by regions of the adhesive layer 30a on respective protrusions 35 of the third substrate 30. Accordingly the components 11 connected to the electric circuit parts 30e can be transferred in one step to the fourth substrate 40.

In some embodiments, e.g. as shown in FIG. 8B, contact is made between the circuit and the fourth substrate 40 while the adhesive layer 30a is melted, e.g. using light or other heating. For example, the fourth substrate 40 comprises a pressure sensitive adhesive or a connection with the fourth substrate 40 is established in another way. In other or further embodiments, the circuit with components may be transferred contactlessly, e.g. using a light pulse.

In some embodiments (not shown), the third substrate 30 comprises a mask pattern which is used for exposing a photo-curable material on the fourth substrate 40. For example, the mask pattern comprises a circuit pattern to be used for connecting the components. For example, the photo-curable material may be altered by exposure to the light to change its conductivity. In this way electrical pathways can be formed by the exposure. Alternatively, or additionally, the photo-curable material may be developed after the exposure, possibly before the components are placed. In some embodiments, electrical connections, e.g. soldering may be established afterwards. Advantageously, this may allow automatic alignment between the components and destination circuit layout.

In some embodiments (not shown), one or more of the first, second, third, or fourth substrates comprise alignment marks for relative alignment, e.g. of the components with the recesses, or the recessed components with the destination circuit. For example, the alignment marks may be detectable through a respective the substrate by light exposure.

Figure 9A:
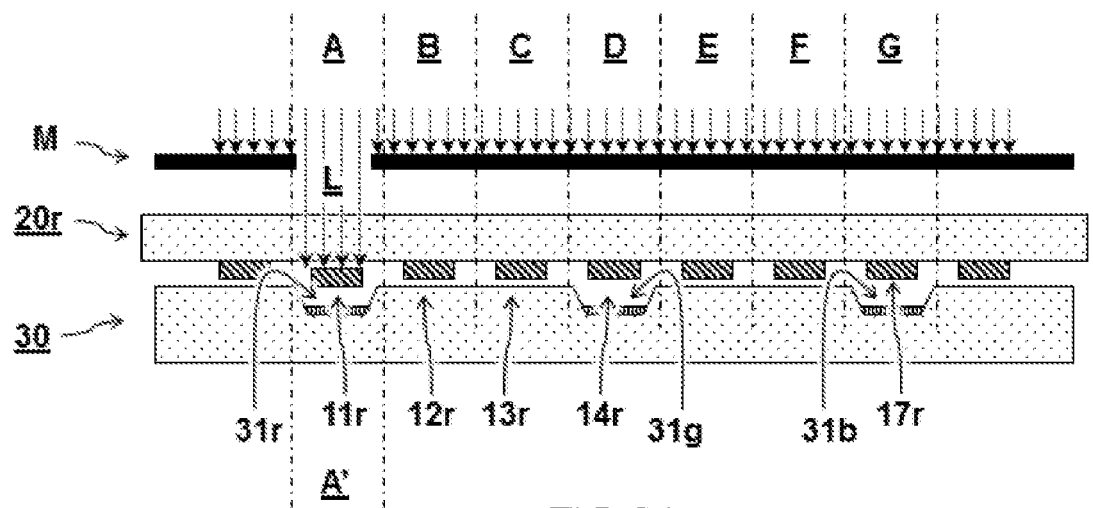
FIGS. 9A-9C illustrate transferring different components from respective second substrates to a common third substrate.
Figure 9B:
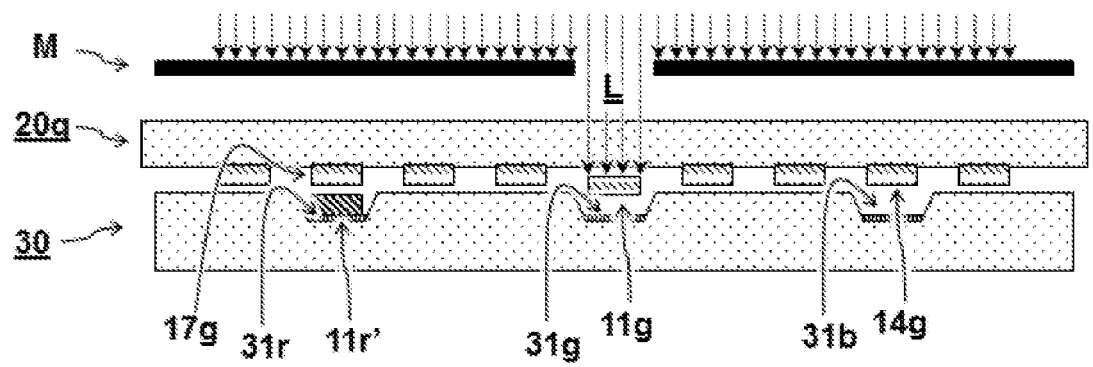
Figure 9C:
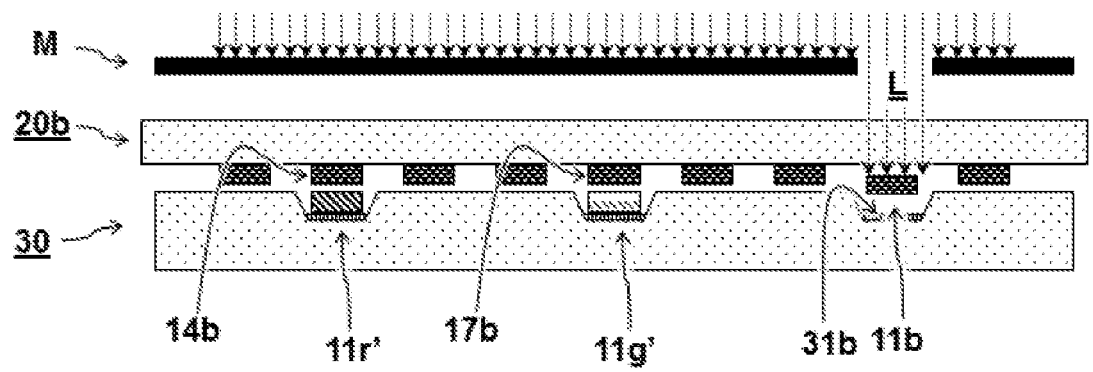

FIGS. 9A-9C illustrate transferring different components $11r,11b,11g$ from respective second substrates $20r,20g,20b$ to a common third substrate 30.

In the embodiment shown, the light "L" is patterned according to the first component layout "A". In other words, the light "L" is exclusively projected onto the first subset of components 11 and/or the light "L" is blocked from projecting onto any of the other component layouts (here layouts "B" through "G"). For example, a mask is disposed between the light source (not shown here) and second substrate 20. A mask can be particularly useful for light sources such as a flash lamp. For example, the mask passes or reflects light to project onto the first component layout "A" while preventing light from projecting onto at least the second component layout "B", and in this case also preventing light onto any of the other layouts. Alternatively or in addition to a mask, the light can be patterned or otherwise localized in different ways, e.g. one or more relatively narrow or focused beams of (laser) light can be used.

FIG. 9A illustrates a first component transfer, according to some embodiments, wherein a first component $11r$ is transferred from a second substrate $20r$ in a first recess $31r$ on the third substrate 30. Of course also multiple of the same first components $11r$ can be transferred at different locations depending on the first component layout A. In the embodiment shown, e.g. components $12r,13r$ are in contact with the third substrate 30 so they remain on the second substrate $20r$. In the embodiment shown, another component $14r$ on the second substrate $20r$ is suspended over a second recess $31g$ but not illuminated by the light "L" and thus not transferred during the first component transfer into the second recess $31g$. The same is also the case for component $17r$ here. In some embodiments, e.g. as shown, a mask M is disposed in the light beam to selectively block light from reaching said other component $14r$. Alternatively, light is selectively directed, e.g. by a mirror.

FIG. 9B illustrates a second component transfer, according to some embodiments, wherein a second component $11g$ is transferred into the second recess $31g$. In some embodiments, the second component $11g$ is transferred from another second substrate $20g$. For example, the second substrate $20g$ is different from the second substrate $20r$, e.g. comprising different components. In the embodiment shown, another component $17g$ on the second substrate $20g$ is suspended over the previously deposited first component $11r'$ in the first recess $31r$. Preferably, though not necessarily, said other component $17g$ is not in contact with the previously deposited first component $11r'$. For example, the first recess $31r$ is deeper than a thickness of the previously deposited first component $11r'$. This may prevent inadvertent transfer of said other component $17g$. Furthermore, as shown, during the second component transfer, yet another component $14g$ on the second substrate $20g$ may be suspended over a third recess $31b$ but not illuminated by the light "L" and thus not transferred into the second recess $31g$.

FIG. 9C illustrates a third transfer step, according to some embodiments, wherein a third component $11b$ is transferred from yet another second substrate $20b$ in the third recess $31b$ on the third substrate 30. In the embodiment shown, other components $14b,17b$ on the second substrate $20b$ are suspended above the previously deposited first and second components $11r',11g'$ in the respective first and second recesses.

In some embodiments (not shown), the third substrate 30 comprises redundant recesses which can be used to deposit additional components e.g. for repairing a device with broken components such as a display screen with broken pixels. Some aspects of the present disclosure may provide a method for repairing a third substrate 30 with previously deposited components 11 in recesses 31, e.g. previously manufactured according to a method as described herein or otherwise. For example, in some embodiments the third substrate 30 comprises redundant empty recesses adjacent the recesses 31 with the previously deposited components 11. Accordingly, a repair method may e.g. comprise locating a broken component among the previously deposited components 11 and adding another component in a redundant recess adjacent the broken component using a method as described herein. Instead of using redundant recesses, the substrate may also be repaired by removing broken components in any way and proceeding with the insertion of a new component in the recess cleared of the broken component according to the method as described herein.

These or other methods of repair may also be incorporated as part of a manufacturing process, e.g. by testing and/or locating the presence of broken components on the third substrate after one or more initial transfer steps. If broken components are detected and/or located, the methods as described herein can be used to fix or supplement any broken components to repair the third substrate For example, a method for manufacturing a display screen may comprise manufacturing a third substrate with components in recesses according to the methods described herein, wherein the components are light emitting devices forming pixels. If any broken pixels are found, these can be repaired as described by adding additional components. Alternatively, or in addition to using redundant recesses, broken components may also be removed from their respective recesses and replaced by the methods as described herein.

Figure 10A:
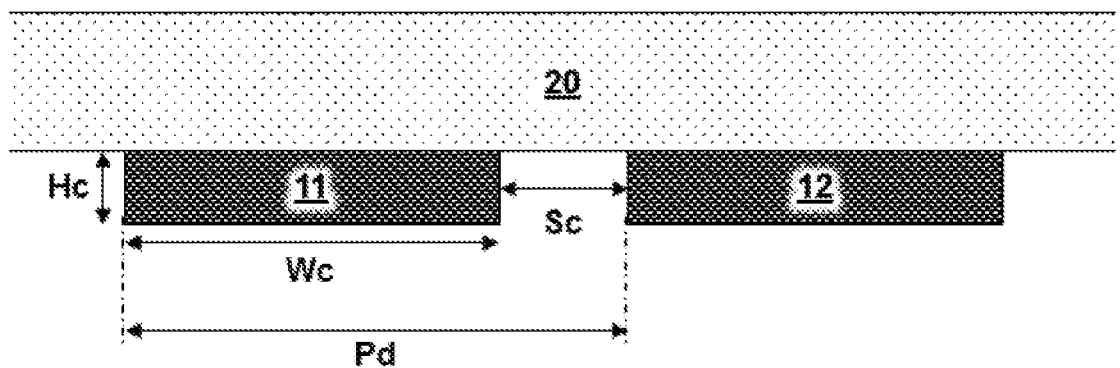
FIGS. 10A-10C illustrate possible shapes, sizes, and distances according to some embodiments.

FIG. 10A schematically illustrates relative sizes and distances between components on the second substrate 20 (which may be the same on the first substrate 10).

In some embodiments, e.g. as shown, neighboring components 11,12 on the second substrate 20 are spaced apart by an inter-component spacing Sc. For example, the inter-component spacing Sc is less than ten micrometer, preferably less than five micrometer, or less, e.g. between one and three micrometer. Advantageously, the smaller the inter-component spacing Sc between the components, the more effective the surface of the second substrate 20 or precursor substrate, e.g. growth substrate, may be utilized.

In the embodiment shown, the components 11,12 have a component diameter Wc (along a surface of the second substrate 20). For example, the component diameter Wc is less than hundred micrometer, preferably less than fifty micrometer, or even less than five micrometer, e.g. between 0.1-100 μm. Advantageously, the smaller the components, the more components fit the surface and hence, the more efficiently a surface can be used as a source for the component transfer.

In the embodiment shown, the components 11,12 have a component thickness He (transverse to the surface of the second substrate 20). For example, the component thickness He is less than ten micrometer, preferably less than five micrometer, ore even less than three micrometer, e.g. between 0.1-10 μm. Advantageously, the thinner the components, the less material is needed for their manufacture, which may allow cheaper production.

In some embodiments, as shown, it may be preferably that the component diameter Wc is greater than the component thickness Hc, e.g. by a factor of at least two, three, five, or more. Advantageously, components with a diameter that is relatively large compared to their thickness may be more suitable for transfer as described herein, e.g. heat more quickly by the light and less prone to rotation while transferring mid air.

Figure 10B:
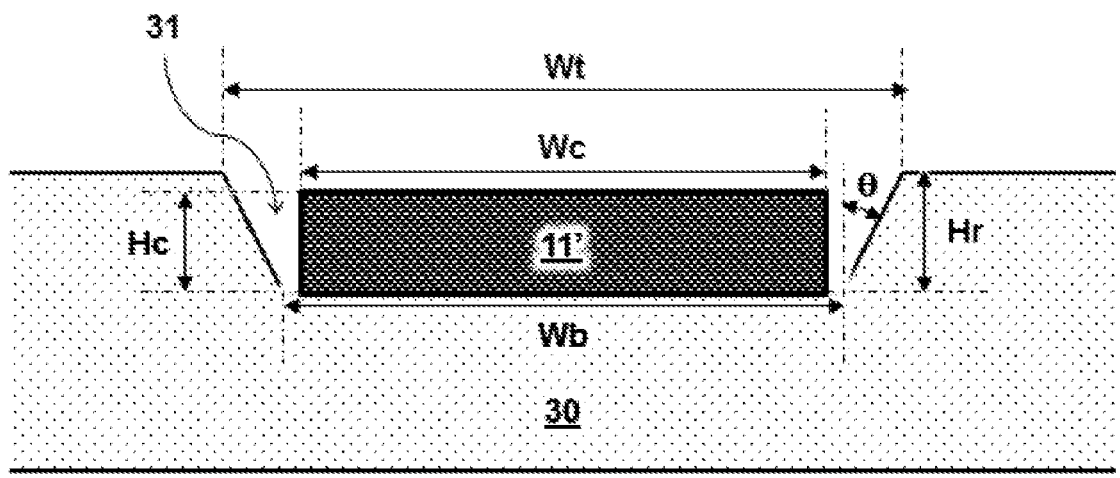

FIG. 10B schematically illustrates an embodiment of a third substrate 30 with a component 11 disposed in a recess 31.

In the embodiment shown, the bottom of the recess 31 has a bottom diameter Wb that is at least equal to the component diameter Wc. Otherwise it may be difficult to fit the component in the recess. Preferably, a bottom of the recesses 31 has a bottom diameter Wb that is less than 1.3 times the component diameter Wc, preferably less than 1.2, more preferably less than 1.1 times, e.g. between 1.00 and 1.05 times the component diameter Wc. Advantageously, the tighter the fit between the component diameter Wc and the bottom diameter Wb, the more accurate may the target position be defined.

In the embodiment shown, a top of the recess 31 has a top diameter Wt that is at least equal to the bottom diameter Wb, preferably larger by a factor or at least 1.1, more preferably at least 1.2, e.g. the top diameter Wt is between 1.2 to 1.5 times the bottom diameter Wb. Advantageously, by providing the recesses with a top diameter that is relatively wide compare to the bottom diameter, it may be easier to transfer the components into the recesses. In other or further embodiments, as shown, the outer edges of the recesses 31 are sloped at an angle θ with respect to a surface normal of the third substrate 30 and/or bottom. For example, the angle θ is more than ten degrees, preferably more than twenty degrees or more than thirty degrees, e.g. between forty and seventy degrees. Advantageously, sloped outer edges may held guide the components into the recesses, even if the component layout on the second substrate is slightly misaligned with respect to the recesses. In some embodiments, the sloped edges may provided further functionality such as reflecting light emitted by a component in the recess.

Preferably, the recesses have a depth Hr that is at least equal half the component thickness Hc, preferably deeper. By providing sufficient recess depth, the third substrate may be sufficiently removed for effective component transfer. In some embodiments, as shown, the recesses have a depth Hr that is at least equal the component thickness Hc, preferably deeper e.g. by a factor of at least 1.01 or more, e.g. the recess depth Hr is between 1.1 and 1.5 times the component thickness. By providing recesses with depth greater than the component thickness, the components may be completely below the surface of the third substrate which can be of benefit for various reasons, e.g. in a subsequent transfer step or to connect electrodes to a top of the component flush with the top surface of the third substrate.

Figure 10C:
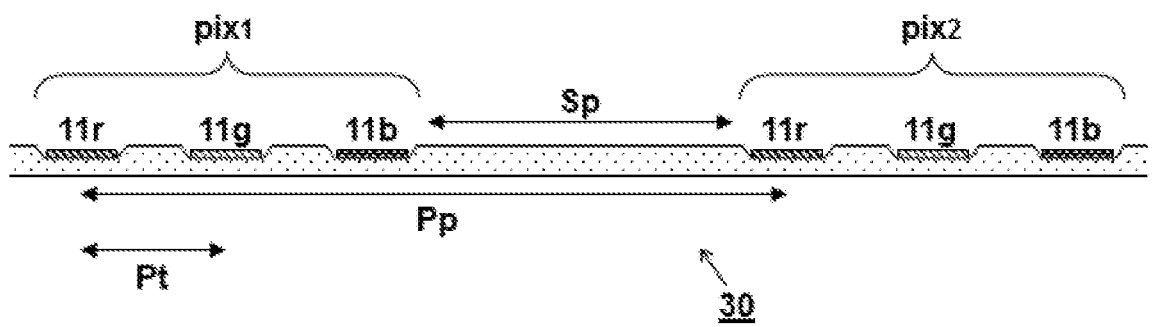

FIG. 10C schematically illustrates an embodiment of a third substrate 30 with different components 11r,11g,11b, e.g. manufactured as described with reference to FIGS. 9A-9C.

In some embodiments, e.g. as shown, a periodic distance or pitch Pt of components on the third substrate 30 is greater than a periodic distance or pitch Pd of components on the second substrate 20, e.g. by a factor of at least two, three, five, or more. For example, the pitch Pd of components on the second substrate 20 is ten micrometer while the pitch Pt of components on the third substrate 30 is more than twenty micrometer, e.g. up to hundred micrometer, or more.

In some embodiments, the components 11 comprise light emitting devices, e.g. μLEDSs. In other or further embodiments, the components are grouped. For example, each group comprises light emitting devices configured to emit different colors, e.g. red, green and blue. In the embodiment shown, the groups of components 11r,11g,11b form pixels indicated as pix1 and pix2 here. For example, the third substrate 30 is part of a display screen, e.g. a monochrome or color display. In the embodiment shown, the groups of components, e.g. pixels, are spaced apart with an inter-pixel spacing Sp that is greater than the inter-component spacing Sc, though this is not necessary. Typically the pixels have a pitch Pp between forty and four hundred micrometer, or more. For example, a resolution of 70 pixels per inch PPI may correspond to a pitch of 25400/70=363 μm. For example, a resolution of 600 PPI may correspond to a pitch of 42 μm. So for a resolution of 600 PPI, the pitch Pt of grouped components may be even smaller, e.g. 42 μm/3 components=14 μm micrometer per component or smaller. Of course also other resolutions are possible.

Figure 11A:
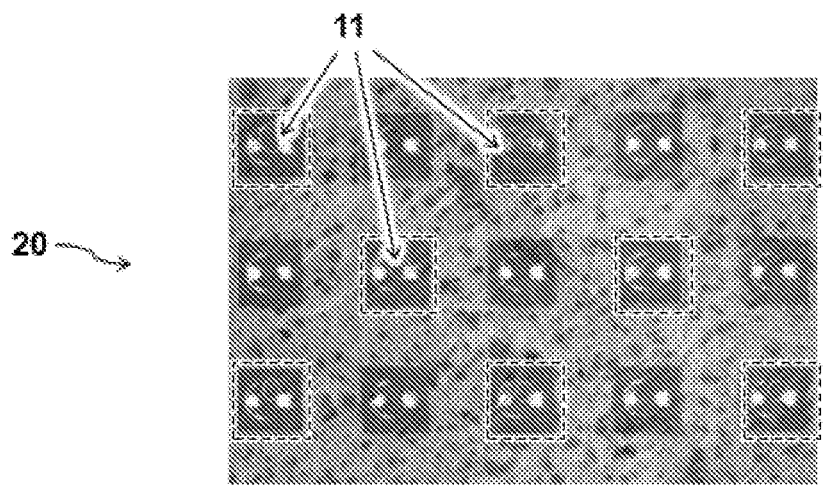
FIGS. 11A-11C show plan view photographs of transferring a subset of components from a second substrate to a third substrate.
Figure 11B:
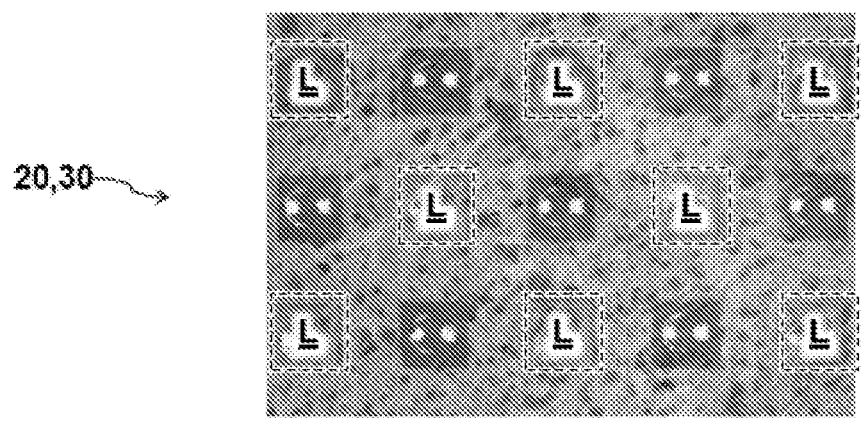
Figure 11C:
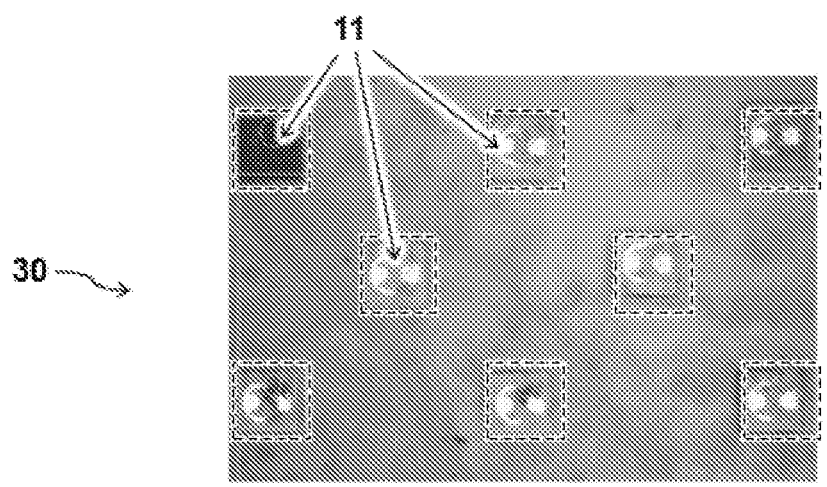

FIGS. 11A-11C show plan view photographs demonstrating selective transfer of components 11 from a second substrate 20 to a third substrate 30. FIG. 11A illustrates alignment of the light (L) on the components with the laser system. FIG. 11B illustrates an image after transferring the components to the third substrate 30 with the (transparent) second substrate 20 still on top. FIG. 11C illustrates the transferred components 11 on the third substrate 30 after removing the second substrate 20.

For the purpose of clarity and a concise description, features are described herein as part of the same or separate embodiments, however, it will be appreciated that the scope of the invention may include embodiments having combinations of all or some of the features described. For example, while embodiments were shown in cross-section view with a rows of components, of course the substrates and layouts can be two dimensional, e.g. comprising additional rows of component in various layouts. Also alternative ways may be envisaged by those skilled in the art having the benefit of the present disclosure for achieving a similar function and result. E.g. features of different layouts may be combined or split up into one or more alternative embodiments.

Hybrid contact/non-contact approaches as described herein may have advantages for targeted component, e.g. with the design of the cavity adapted to the component dimensions, a mechanical self-alignment is provided ensuring a high placement accuracy. This can be optionally further enhanced through reflow self-alignment in the cavity. For non-targeted components: during the transfer process, non-targeted components remain in contact with the receiving substrate, providing, on the one hand, a mechanical stop against undesired/accidental transfer. On the other hand, the physical contact of components with the receiving substrate enables an additional approach for selective transfer. While some transfer methods may use a patterned light-source directing the light only to the targeted components, the physical contact of the components can provide a heat-sink at the non-targeted locations, enabling selective component transfer also with a non-patterned light-source. Also, the non-targeted components in contact with the substrate may ensuring a well-defined stand-off height for the targeted components.

The various elements of the embodiments as discussed and shown thus offer various advantages, including an advantage that parts where the third substrate contacts the non-transferred components may prevent their transfer by physical blocking and heat-sinking, the advantage that in a second iteration (e.g. with different LEDS), the previously placed components do not obstruct the new components; an advantage that the recesses can provide alignment and constriction of placed components; and advantage that sloped edges of the recesses could further help with placement and may also provide a reflection surface e.g. for the LEDS. Of course, it is to be appreciated that any one of the above embodiments or processes may be combined with one or more other embodiments or processes to provide even further improvements in finding and matching designs and advantages. It is appreciated that this disclosure offers particular advantages to manufacture and repair of display, particularly using microscopic sized LEDs, and in general can be applied for any application wherein components are selectively transferred by light.

Aspects of the present disclosure may be embodied by an apparatus configured and/or programmed to perform the methods. For example, the apparatus comprises respective substrate handlers to provide the various substrates and relatively position them with respect to each other and/or with respect to a light source for delivering the light to the substrates. In some embodiments, the substrate handlers, light source, and/or optional mask between the light source and substrate(s) can be moved by one or more actuation and/or alignment mechanism. Also other components, e.g. mirrors to direct a laser beam may be controlled. The action of these and other components may be determined by a controller, e.g. with hardware and/or software components, to perform operational acts in accordance with the present methods. Aspects of the present disclosure may also be embodied as a (non-transitory) computer-readable medium storing instructions that, when executed by one or more processors, cause a device to perform the method as described herein.

In interpreting the appended claims that follow, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise.

The invention claimed is:

1. A method of transferring components, the method comprising:
   providing a first substrate with the components;
   providing a second substrate with an adhesive layer comprising a hot melt adhesive material;
   contacting, while the adhesive layer is in a melted state, the components on the first substrate with the adhesive layer on the second substrate;
   letting the adhesive layer solidify, after the contacting, to form an adhesive connection between the components and the second substrate;
   moving apart, after letting the adhesive layer solidify, the first substrate and the second substrate to affect a transfer of the components from the first substrate to the second substrate by using the adhesive connection of the adhesive layer; and
   transferring, after the moving apart, at least a first subset of the components from the second substrate to a third substrate by radiating light onto at least a first set of adhesive regions of the adhesive layer holding the at least first subset of components,
   wherein the light causes the adhesive material at the first set of adhesive regions to melt and thereby causes a release of the at least first subset of components for transfer to the third substrate,
   wherein the light causes at least the first set of adhesive regions to melt and form one or more respective jets of melted adhesive material, and
   wherein the at least first subset of components is transferred over a distance to the third substrate with the jets of melted adhesive material propelling the first subset of components from the second substrate towards the third substrate.

2. The method according to claim 1, wherein during the transferring from the second substrate to the third substrate, the third substrate is disposed below the second substrate, and
   wherein, during the transferring, the first subset of components falls in a non-contact manner over a distance from the second substrate to the third substrate.

3. The method according to claim 1, wherein, during the transferring by radiating light, a distance between the components on the second substrate and a destination surface on the third substrate is less than twice a cross-section diameter of the components.

4. The method according to claim 1, wherein the adhesive layer is configured to absorb at least thirty percent of the light received on an opposing surface of the second substrate, before the light reaches the components during the transferring.

5. The method according to claim 1, wherein:
   the first subset of components is arranged according to a first component layout on the second substrate;
   the third substrate comprises corresponding recesses disposed at least at relative positions corresponding to the first component layout;
   the second substrate and the third substrate are aligned to have the first subset of components suspended over the corresponding recesses without contacting the third substrate; and
   the light is projected onto at least the first component layout on the second substrate to transfer the first subset of components across and into the corresponding recesses of the third substrate.

6. The method according to claim 1, wherein:
   the components on the second substrate are divided in different subsets including a second subset of components arranged according to a second component layout;
   the third substrate comprises corresponding protrusions formed by non-recessed areas of the third substrate disposed at least at relative positions corresponding to the second component layout;

during aligning the second substrate and the third substrate, the second subset of components is in contact with the corresponding protrusions of the third substrate; and after the transferring, the second subset of components remains attached to the second substrate.

7. The method according to claim 1, wherein an electrically conductive material is applied to the components while the components are disposed on the third substrate.

8. The method according to claim 7, wherein the components are transferred from the third substrate to a fourth substrate, wherein the electrically conductive material is melted by a same light pulse as used for transferring the components for electrically connecting the components by the conductive material to the fourth substrate.

9. The method according to claim 1, wherein the third substrate comprises a hot melt adhesive layer to hold the components after transfer.

10. The method according to claim 1, wherein one or more of the substrates comprise alignment marks for relative alignment.

11. The method according to claim 9, wherein the components are held by regions of the adhesive layer in respective recesses of the third substrate, wherein electric circuit parts connected to the components are held by regions of the adhesive layer on respective protrusions of the third substrate, and wherein the first subset of components connected to the electric circuit parts are transferred to a fourth substrate.

12. The method according to claim 11, wherein the third substrate comprises a mask pattern that is used for exposing a photo-curable material on the fourth substrate.

13. The method according to claim 1, wherein a second subset of components is selected for transfer during a second component transfer, wherein the second component transfer is separate from a first component transfer of the first subset of components, wherein the second component transfer comprises aligning the second substrate with a remaining second subset of components over the third substrate or another third substrate comprising recesses disposed at least at relative positions corresponding to the second component layout, and wherein, during the second component transfer, light is projected onto at least the second component layout on the second substrate to transfer the second subset of components into the corresponding recesses.

14. The method according to claim 1, wherein during a first component transfer, a first component is transferred from one donor substrate in a first recess on the third substrate, wherein during subsequent a second component transfer, a different, second component is transferred from another donor substrate into a second recess, and wherein the different first component and second component are transferred together from the third substrate to a fourth substrate.

* * * * *